(12) United States Patent
Tamura et al.

(10) Patent No.: US 8,319,542 B2
(45) Date of Patent: Nov. 27, 2012

(54) INTEGRATED CIRCUIT INCLUDING BYPASS SIGNAL PATH

(75) Inventors: Hirotaka Tamura, Kawasaki (JP); Masaya Kibune, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 120 days.

(21) Appl. No.: 12/442,459

(22) PCT Filed: Sep. 29, 2006

(86) PCT No.: PCT/JP2006/319539
§ 371 (c)(1),
(2), (4) Date: Mar. 23, 2009

(87) PCT Pub. No.: WO2008/041292
PCT Pub. Date: Apr. 10, 2008

(65) Prior Publication Data
US 2010/0019827 A1  Jan. 28, 2010

(51) Int. Cl.
*H03K 17/00* (2006.01)
(52) U.S. Cl. ........ 327/403; 327/565; 327/566; 714/727; 714/731
(58) Field of Classification Search .................. 327/403, 327/565, 566; 714/727, 731
See application file for complete search history.

(56) References Cited

U.S. PATENT DOCUMENTS

| | | | | |
|---|---|---|---|---|
| 5,260,949 A | * | 11/1993 | Hashizume et al. | 714/731 |
| 5,594,694 A | * | 1/1997 | Roohparvar et al. | 365/201 |
| 5,673,276 A | * | 9/1997 | Jarwala et al. | 714/727 |
| 5,825,712 A | * | 10/1998 | Higashi et al. | 365/230.03 |
| 7,162,676 B2 | * | 1/2007 | Coleman et al. | 714/752 |
| 7,346,819 B2 | * | 3/2008 | Bansal et al. | 714/726 |
| 7,412,627 B2 | * | 8/2008 | Bains et al. | 714/42 |
| 7,430,240 B2 | * | 9/2008 | Parthasarathy | 375/257 |
| 7,475,174 B2 | * | 1/2009 | Chow et al. | 710/74 |
| 7,702,361 B2 | * | 4/2010 | Lai et al. | 455/553.1 |
| 7,724,675 B2 | * | 5/2010 | Kuo | 370/241 |

FOREIGN PATENT DOCUMENTS

| | | | |
|---|---|---|---|
| JP | 64-073946 A | 3/1989 |
| JP | 02-196518 A | 8/1990 |
| JP | 03-262333 A | 11/1991 |
| JP | 04-282913 A | 10/1992 |

\* cited by examiner

*Primary Examiner* — Kenneth B. Wells
(74) *Attorney, Agent, or Firm* — Arent Fox LLP

(57) ABSTRACT

An integrated circuit includes a bypass signal path exchanging, between transceivers which are included in the integrated circuit, a signal transmitted/received between a transceiver of the transceivers and an internal logic circuit which processes data being input/output by transceiver with bypassing the internal logic circuit, a switch switching a pathway of the bypass signal path, and a switch changeover controller transferring a switch control signal that performs a changeover of the switch.

10 Claims, 19 Drawing Sheets

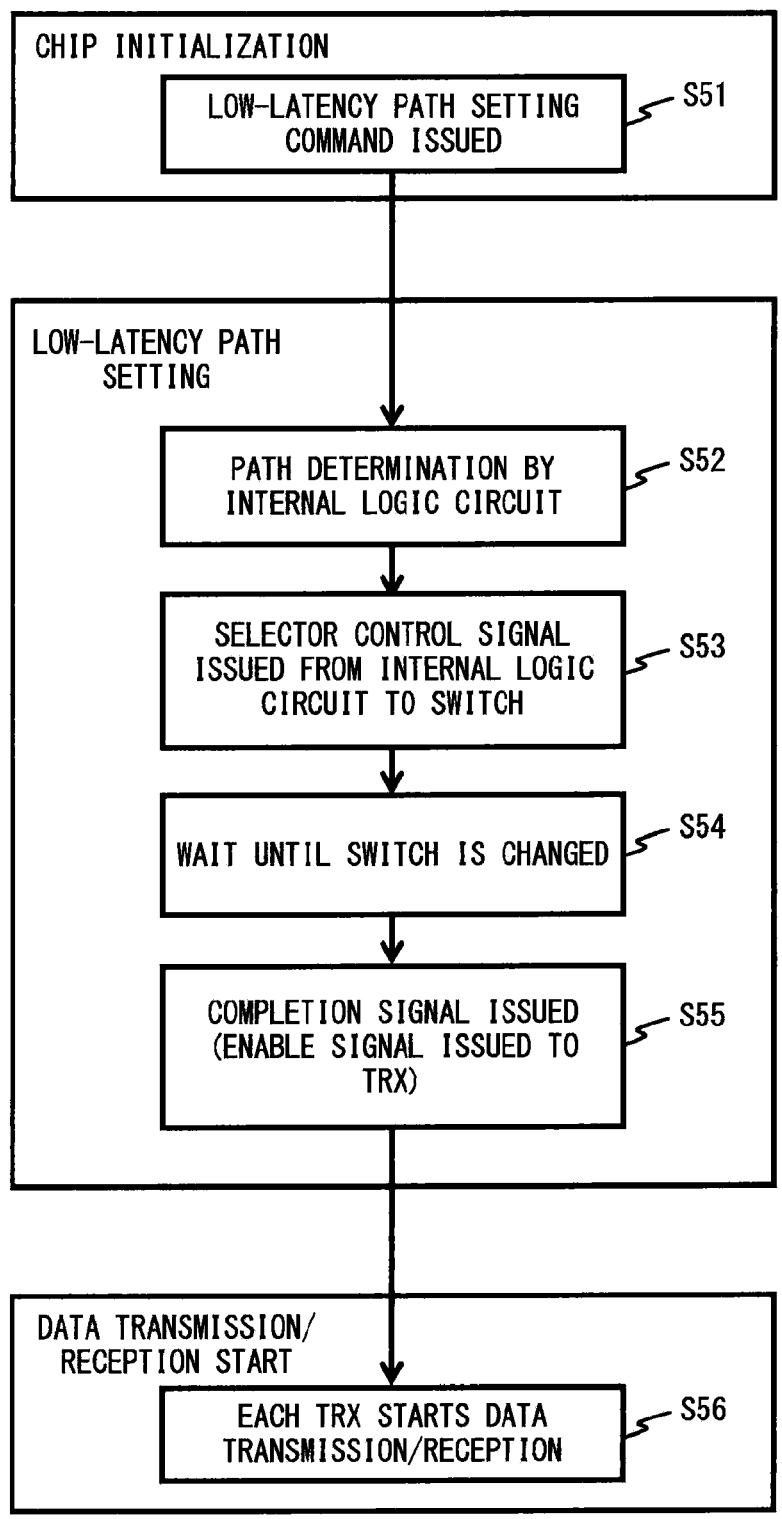
F I G. 5

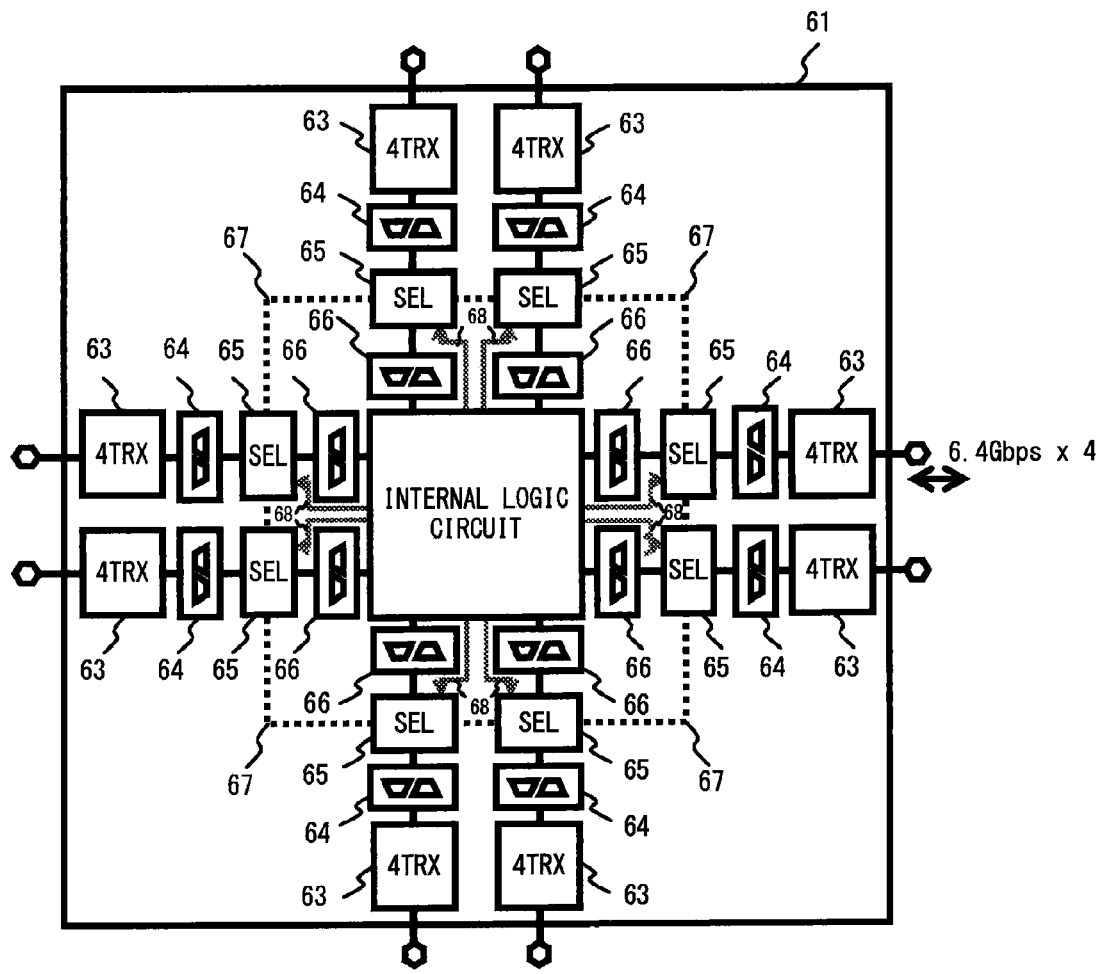
F I G. 6

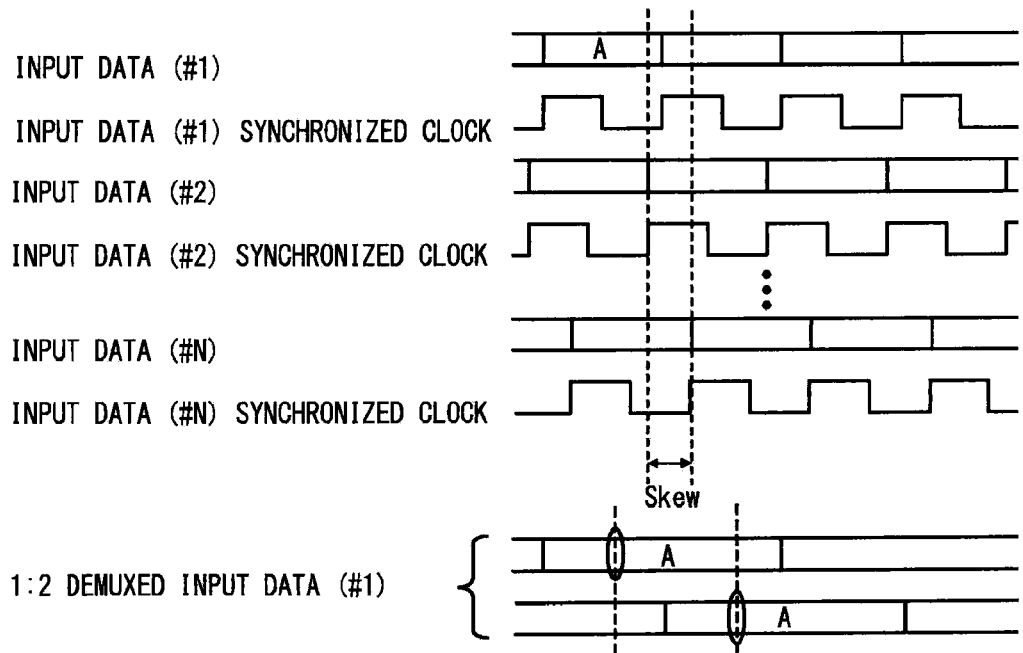
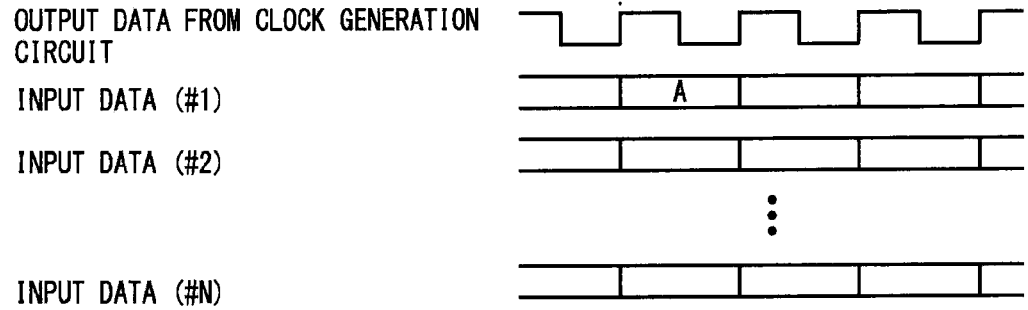
FIG. 10

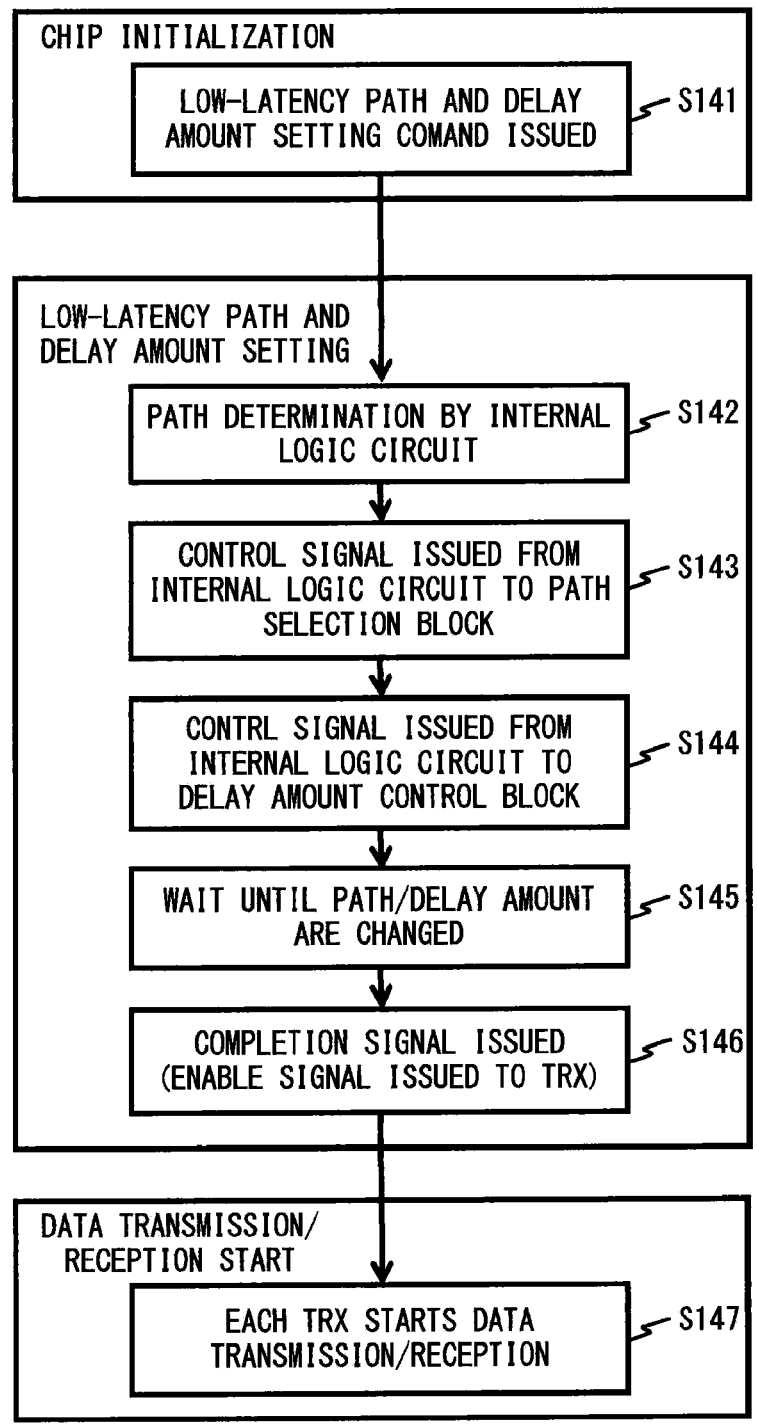
F I G. 14

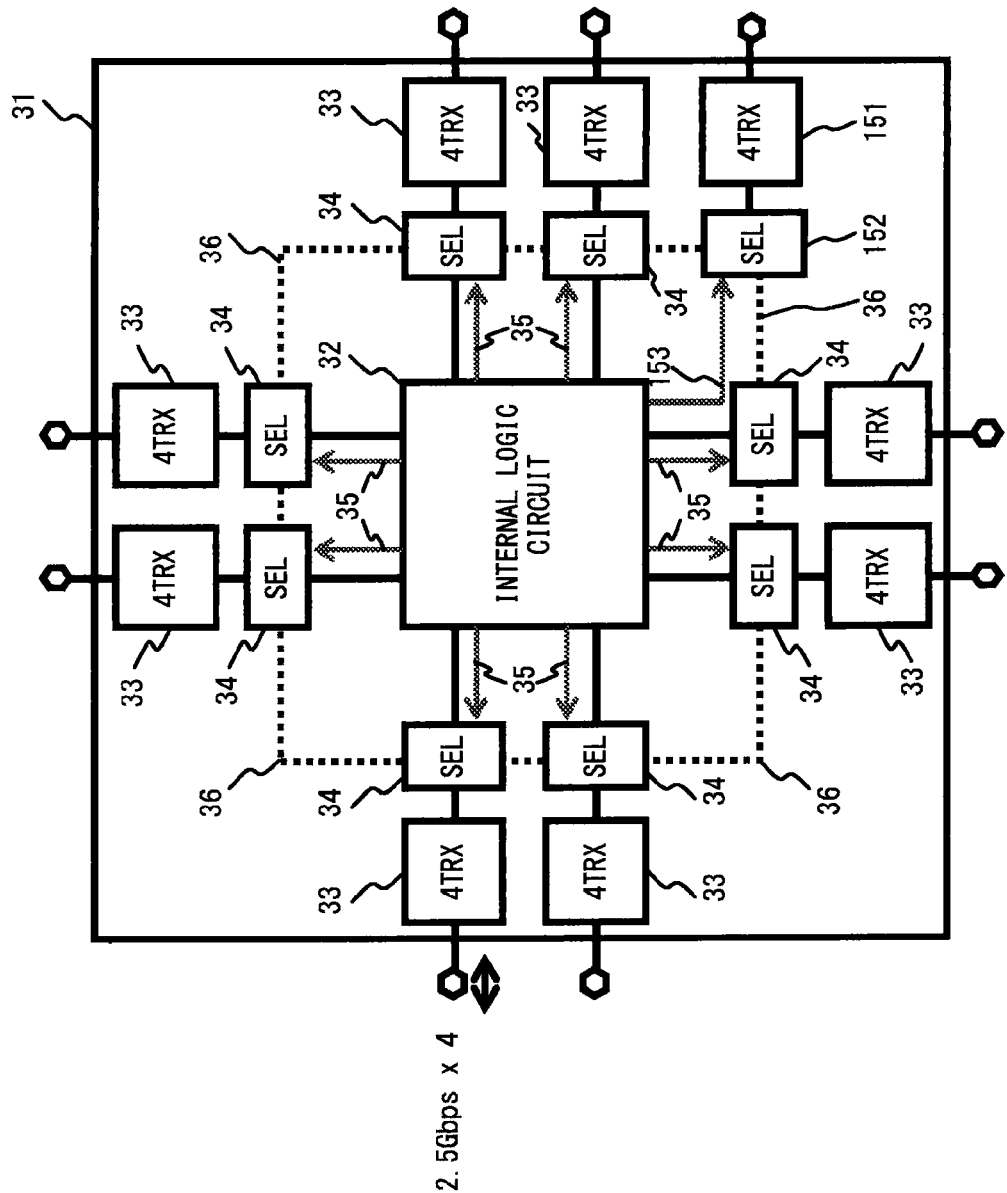
F I G. 15

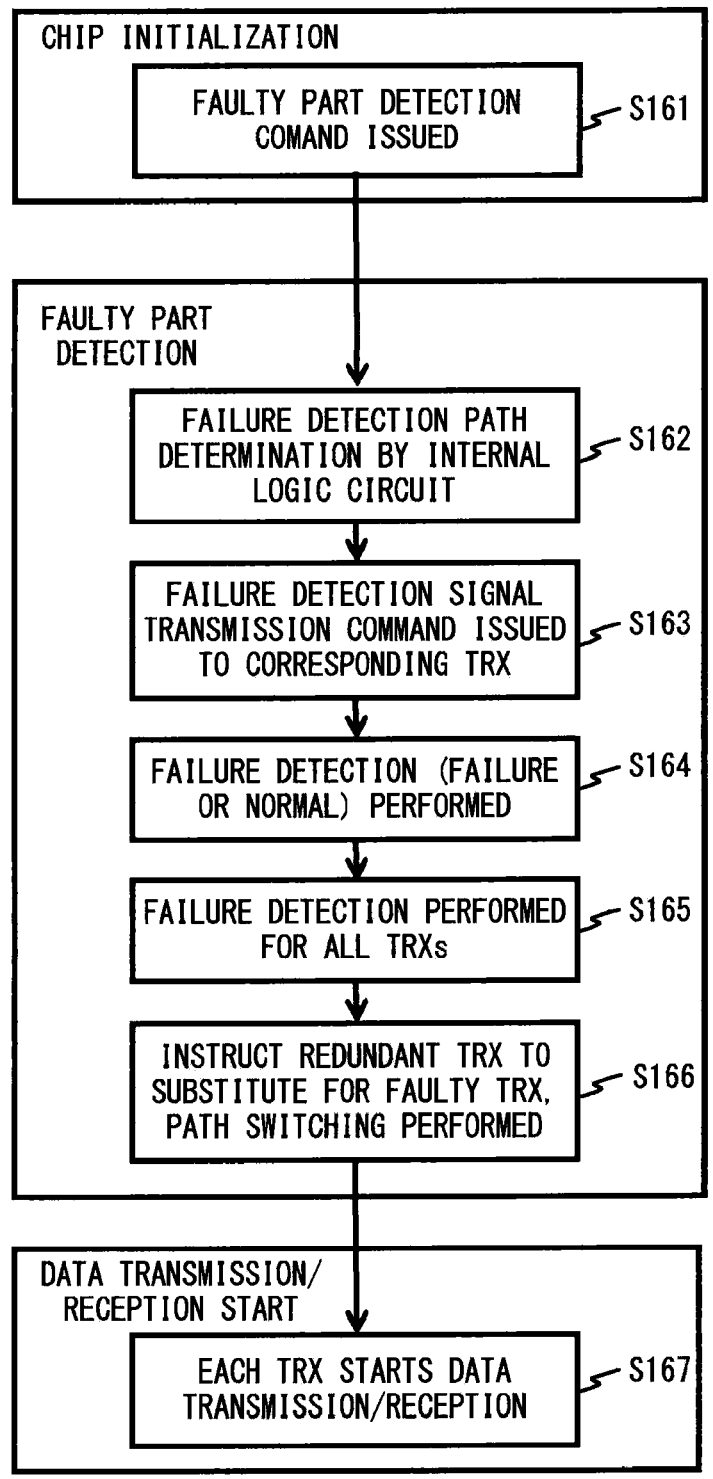
F I G. 1 6

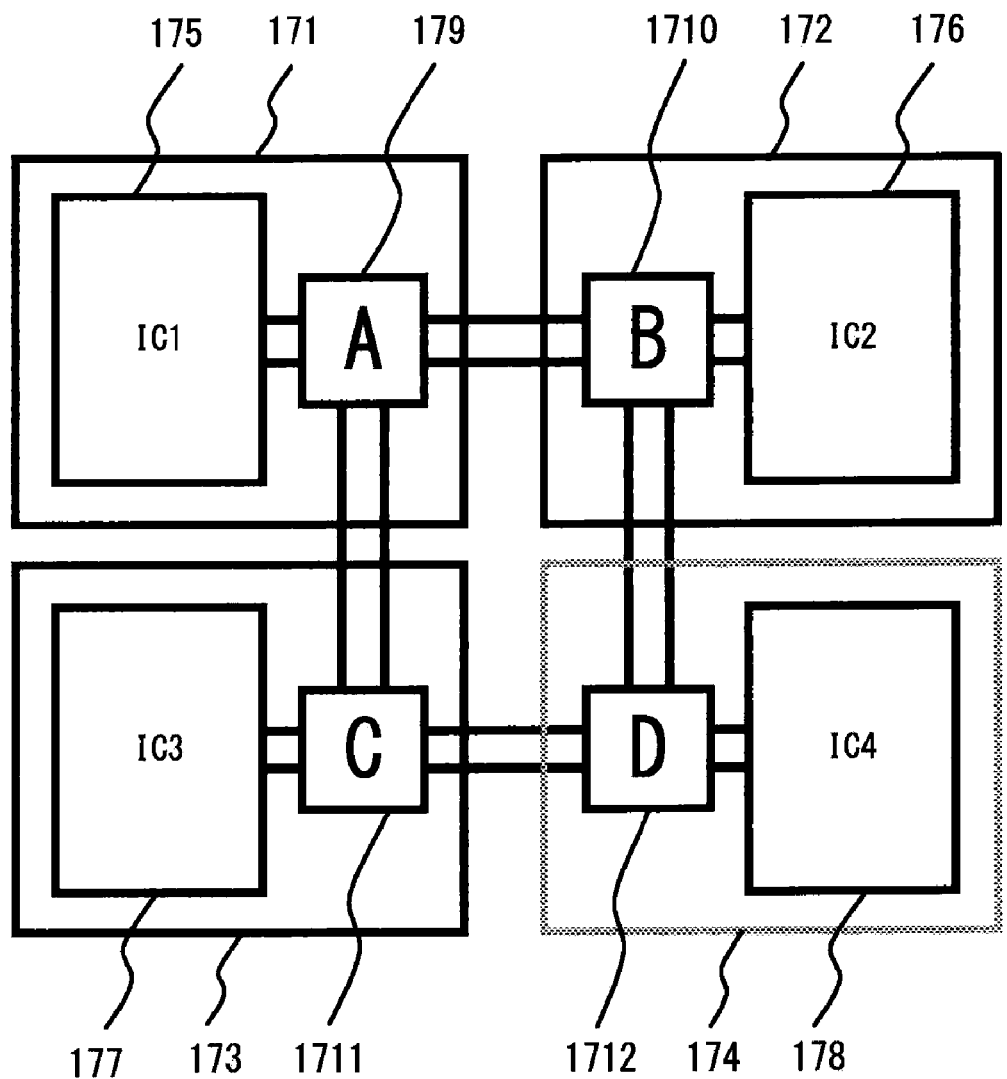
F I G. 1 7

INTEGRATED CIRCUIT INCLUDING BYPASS SIGNAL PATH

FIELD

The embodiments discussed herein are related to an integrated circuit.

BACKGROUND

In recent years, the performance of components constituting a computer and other information processing apparatuses has been improved significantly. This seems to be due particularly to the improvement in the component performance of SRAM (Static Random Access Memory), DRAM (Dynamic Random Access Memory), processors, switch LSI (Large Scale Integration), and so on. However, in order to improve system performance, the signal transmission speed between these components and elements needs to be improved. In this regard, the improvement of system performance includes an increase in the transmission capacity that is measured by bit/sec, a decrease in the transmission delay, and so on.

For example, the gap between the speed of memories such as SRAM, DRAM and that of a processor is expanding, and the gap between the speeds is hindering the improvement of computer performance. In addition, as IC chips become larger, not only the signal transmission between these chips but also the signal transmission speed between elements and between circuit blocks on an IC chip is becoming a significant factor that limits the performance of the IC chip. Furthermore, the signal transmission speed needs to be improved also for the coupling between servers or between boards.

However, with an improvement in the signal transmission speed, in a case where a signal is received at a high data rate on a printed circuit board on which a plurality of IC chips are mounted, the signal quality deteriorates to a large extent, due to signal reflection and crosstalk. In addition, in a case where a plurality of IC chips are mounted on a circuit board and signal lines coupling between the IC chips cross in a complicated way, and with some signals, where a plurality of IC chips are coupled to one signal line, the signal quality deteriorates to a large extent.

The wiring diagram in FIG. 18 includes IC chips 181-184 (IC1-IC4). It is a configuration example of so called multi-drop coupling where IC chips are coupled by signal lines.

Such a wiring of signal lines causes the deterioration of signal quality (distortion of waveform), due to mutual interference between a plurality of signals and multiple reflection of a signal caused by impedance mismatching at a multidrop coupling point.

Therefore, proposals have been made for avoiding the degradation of the signal quality due to the wiring topology having complicated crossing and multidrop coupling. In Japanese Laid-open Patent Publication No. 4-282913, a proposal is made to make it possible to perform signal transmission with little delay, by providing a switch for bypassing an LSI and using the bypass path when there is no need to go through the LSI.

In addition, the switching of signals in a general IC chip is performed with the router function that is built in the signal processing part of the IC chip itself. The router function is realized by a logic circuit. In recent years, with the speeding up of the I/O, the operating frequency of the logic circuit is often a low value being a fraction (for example, $1/4$, $1/8$, $1/16$) of the clock frequency of a signal. Therefore, the router function by means of a logic circuit generates a large signal delay. For this reason, there has been a problem that when all signals are routed through the router function and the logic circuit within a chip, the overall performance of a system deteriorates due to the signal delay.

SUMMARY

According to an aspect of the embodiments, an integrated circuit includes a bypass signal path exchanging, between transceivers which are included in the integrated circuit, a signal transmitted/received between a transceiver of the transceivers and an internal logic circuit which processes data being input/output by transceiver with bypassing the internal logic circuit, a switch switching a pathway of the bypass signal path, and a switch changeover controller transferring a switch control signal that performs a changeover of the switch.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating the control flow of embodiment 1.

FIG. 6 is a diagram illustrating a configuration of a high-speed I/O, the data rate per a signal line of the transceiver being 6.4 (Gbit/sec) while the internal logic circuit is operating with a low clock frequency of 400 (MHz).

FIG. 10 is a diagram illustrating the operation of the timing correction circuit 85.

FIG. 14 is a diagram illustrating the control flow of the configuration illustrated in FIG. 13.

FIG. 15 is a diagram illustrating a configuration to which a redundant circuit is added.

FIG. 16 is a diagram illustrating the control flow of the configuration illustrated in FIG. 15.

FIG. 17 is a diagram illustrating a configuration without a switch control signal path, in which a configuration setting command is transmitted/received via the bypass signal path.

DESCRIPTION OF EMBODIMENTS

Hereinafter, embodiments will be explained in detail with reference to the accompanying drawings.
(Explanation of the Principle)

In order to avoid the degradation of signal quality due to the wiring topology having a plurality of crossings and multidrop coupling, the topology is made with a plurality of IC tips coupled by one-to-one wiring without any crossing part of signal lines. Then, in order to exclude crossed wiring and multidrop wiring on the circuit board, input/output signals are switched within the IC chip.

Figure 1:
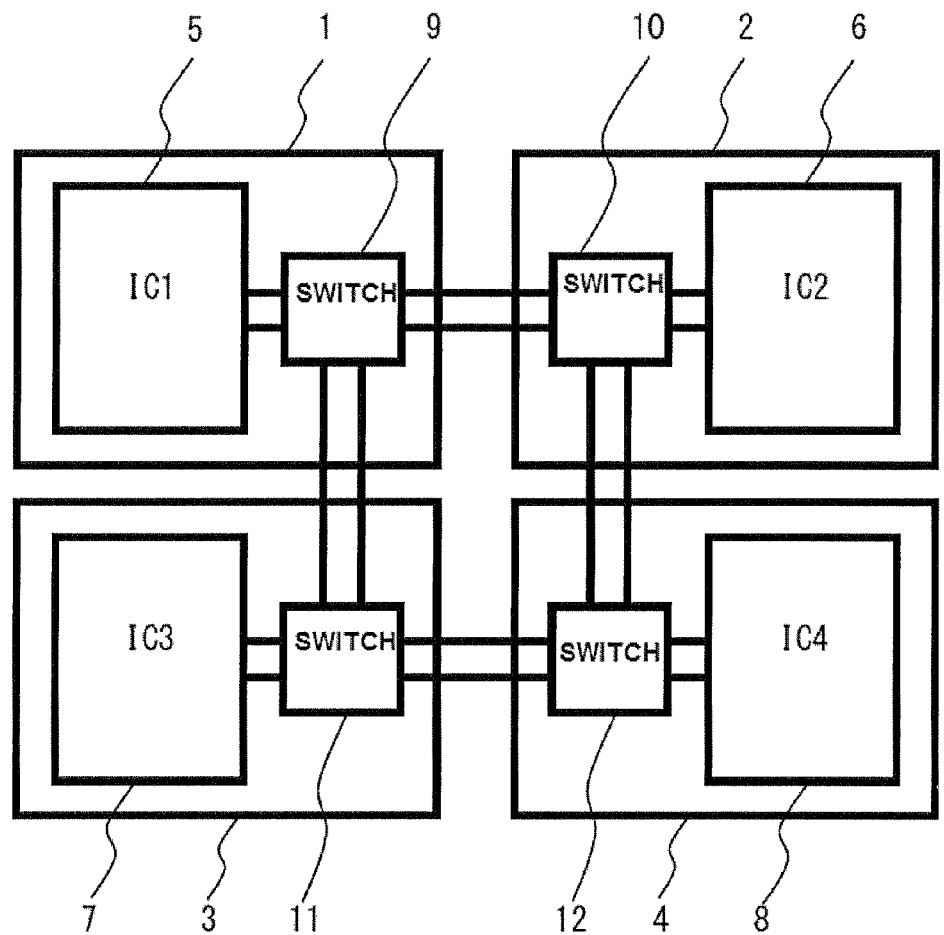
FIG. 1 is a diagram illustrating a principle of an embodiment of the present invention.
Figure 2:
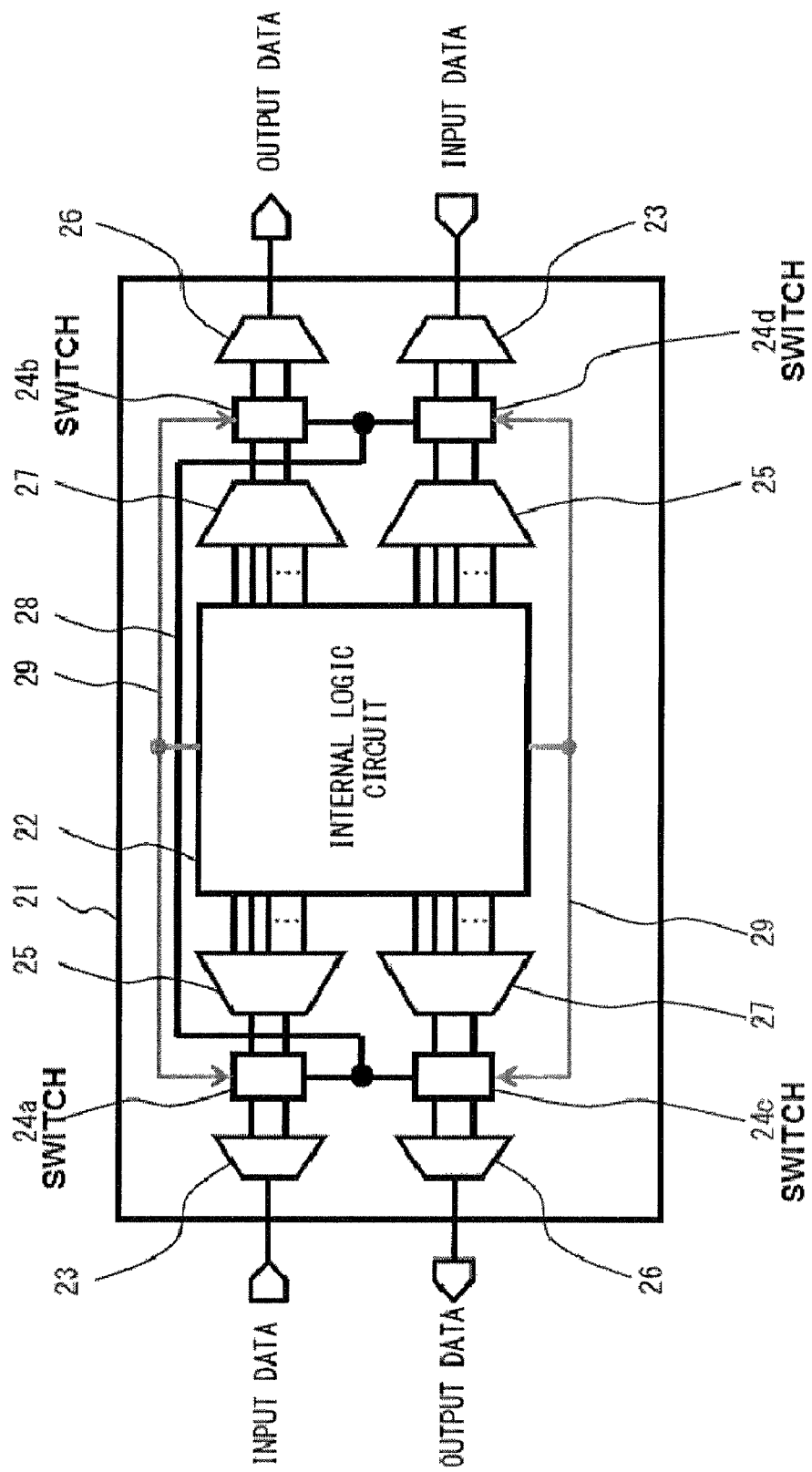
FIG. 2 is a diagram illustrating a principle of an embodiment of FIG. 1 of the present invention.

FIG. 1 and FIG. 2 are diagrams illustrating the principle of the embodiment. The circuit illustrated in FIG. 1 includes IC chips 1-4, in which IC chips 181-184 illustrated in FIG. 18 (conventional) are provided and low-latency switches 9-12 are used for the wiring between respective internal logic circuits 5-8.

Here, the switches 9-12 have a function to transmit data selectively to a certain destination, and are capable of performing multiple groups of data transmission at the similar time. In addition, assuming no internal confliction, the time from receiving a frame at an input port to outputting it through an output port is short in the low-latency switches 9-12.

Here, for example, a crossbar switch is used as the low-latency switch.

Figure 18:
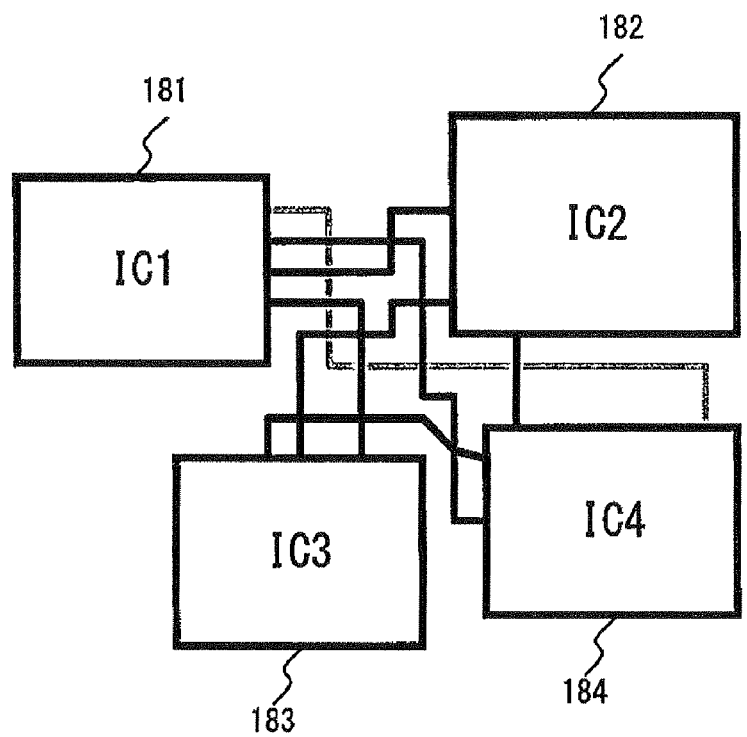
FIG. 18 is a diagram illustrating a conventional example.

Next, the crossing parts in the wiring illustrated in FIG. 18 (conventional) are all taken inside the IC chips 1-4, and all lines are controlled, by the switches 9-12, to be coupled one-to-one. In addition, in a case of transmitting a signal beyond immediately adjacent IC chips 1-4, the signal is transferred hopping a plurality IC chips. The function realizes the crossing of the lines and multidrop coupling effectively.

Meanwhile, FIG. 2 is a diagram illustrating an integrated circuit having a plurality of high-speed I/O transceivers (transmitter and receiver). A circuit 21 illustrated in FIG. 2 includes an internal logic circuit 22 (data processor), demultiplexers 23, 25, a switch 24, multiplexers 26, 27, a bypass signal path 28, and a switch control signal path 29.

The internal logic circuit 22 determines the pathway of the bypass signal path 28. A signal that may not need switching by the internal router logic (the one that may not need any path change once the system configuration is determined) is passed through a low-latency path. In this case, the setting of the switch 24 is changed through the switch control signal path 29, on the basis of the result of the calculation of the path selection performed in the switch changeover controller provided in the internal logic circuit 22. At this time, once the path is selected at the beginning, few path changes may be required after that, and the delay of the internal logic circuit 22 does not matter.

The bypass signal path 28 couples, to another high-speed I/O transmitter, a signal that a high-speed I/O receiver received from outside, bypassing the internal logic circuit 22. The delay in the signal transmission performed while hopping IC chips is reduced by disposing the switch 24 that switches the coupling destination to the bypass signal path 28. All signal couplings may be one-to-one with no delay problem, for a signal that merely goes through IC chips and may not require any internal logic processing.

Here, the front end part of the transceiver that directly transmits and receives a high-speed signal is located in the part that directly couples to the input/output terminal. The high-speed I/O transceiver includes, not only the front end parts that operates at the highest speed, but also the multiplexer and demultiplexer located in the subsequent stage. In FIG. 2, since the switch 24 is located between the coupled multiplexer and demultiplexer, the switch is integrated into the transceiver and the receiver.

For the switching timing of the switch, with respect to the low-latency path, the changeover of the switch may be required to be completed before a signal runs. For this reason, the configuration (which signal is to be coupled to where, which signal is to be transmitted bypassing the integrated circuit and which signal goes through the internal router logic) is determined upon starting up the system (that may include a plurality of integrated circuits coupled by the high-speed I/O according to the embodiment).

In that case, a data format that may distinguish normal data and setting commands for configuration may be required. For example, with the data format, a special code (for example, Command pattern) assigned for the purpose of system control may be transmitted for recognizing non-data.

As described above, the high-speed signal lines on the board may be coupled one-to-one, and the propagation delay of the signal hopping via the chip may also be minimized.

In addition, since the signal lines are couple done-to-one, multiple signal reflection due to multidrop coupling does not occur.

Furthermore, since there is no signal crossing part, the problems of crosstalk and impedance mismatching are reduced, and the transmission rate may be improved while avoiding the problem of the degradation of signal quality, improving the overall system performance.

(Embodiment 1)

Figure 3:
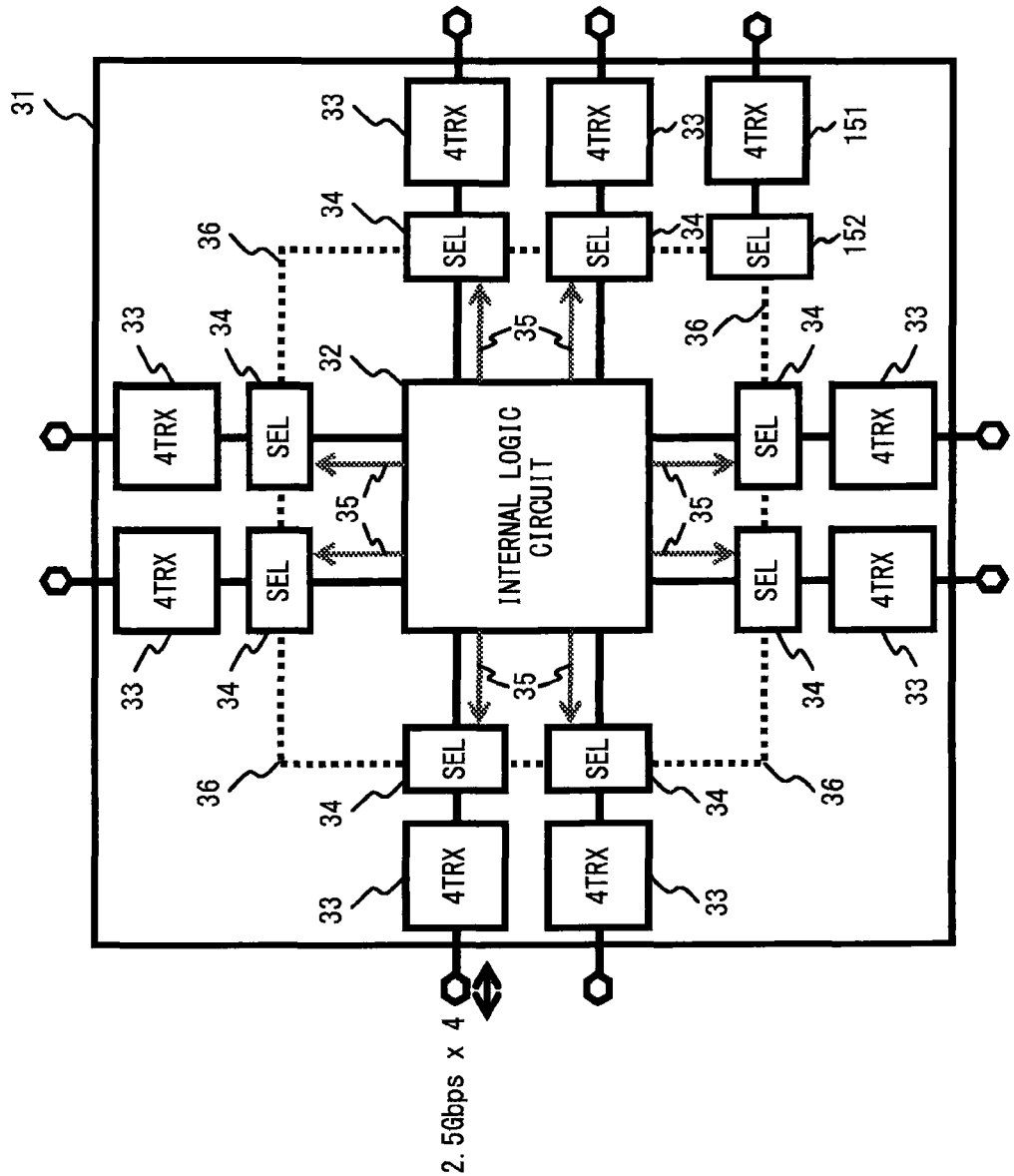
FIG. 3 is a diagram illustrating a configuration of a high-speed I/O, the data rate of the high-speed I/O being 2.5 (Gbit/sec) and the clock frequency of the internal logic circuit being 2.5 GHz.

FIG. 3 is a diagram illustrating a configuration of a high-speed I/O, the data rate of the high-speed I/O being 2.5 (Gbit/sec) and the clock frequency of the internal logic circuit being 2.5 GHz. The configuration in FIG. 3 is made with no multiplexer and demultiplexer. The circuit is configured for a case such as the one in which the clock frequency of the internal logic circuit exceeds several GHz.

An IC chip 31 illustrated in FIG. 3 includes an internal logic circuit 32, high-speed I/O transceivers 33, switches 34, switch control signal paths 35 and a bypass signal path 36.

The four-channel transceiver 33 has eight pairs of I/O ports that respectively include four pairs of high-speed I/O transceivers of which data rate is 2.5 (Gbit/sec). The transceiver in the I/O port performs the exchange of signals with the internal logic circuit 32 of which operating frequency is 2.5 (GHz). A signal received by the high-speed I/O transceiver 33 is transmitted to the internal logic circuit 32, and the data in the internal logic circuit 32 is transmitted to outside by the high-speed I/O transceiver 33. The signal from the high-speed transceiver 33 is coupled to other high-speed transceivers 33 (including its own port) via the bypass signal path 36 and the switch 34, bypassing the internal logic circuit 32.

Any pair of the total eight ports of the high-speed I/O may be coupled via the bypass signal path 36 and the switches 34. The configuration such as the crosspoint type may be used for the switch 34. The crosspoint type using eight 8:1 selectors is adopted in the present example.

Figure 4A:
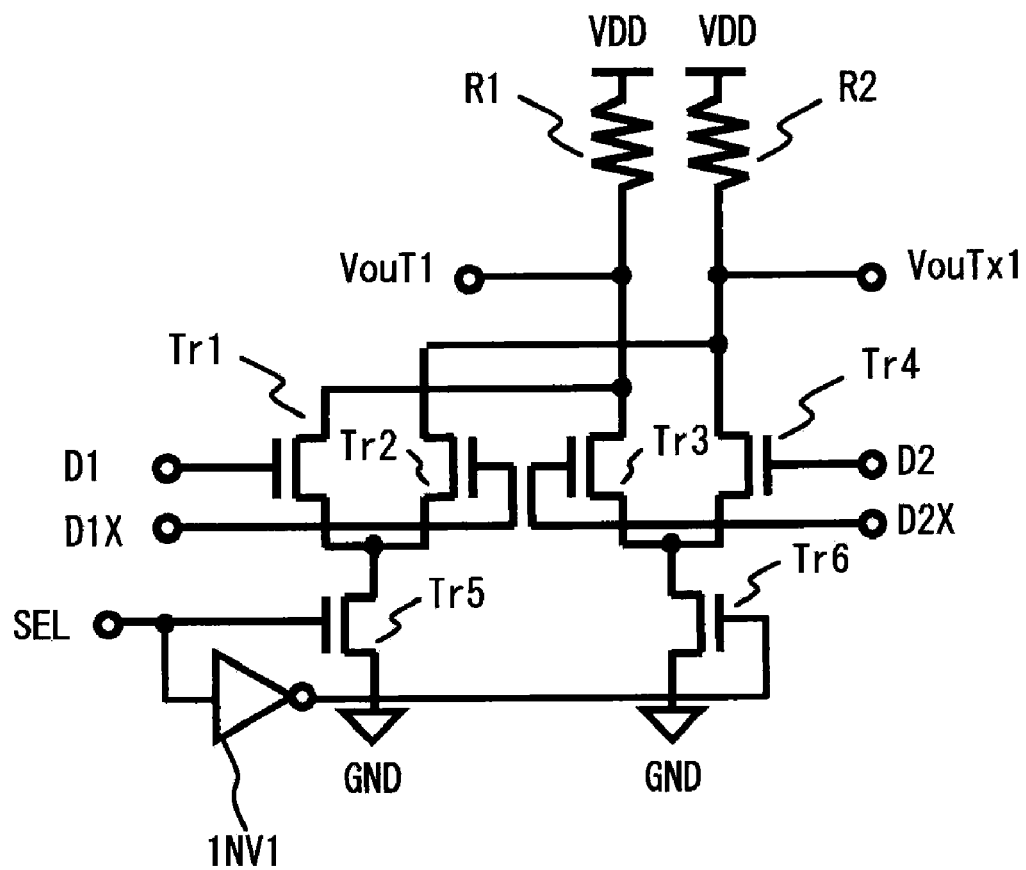
FIG. 4A is a diagram illustrating a configuration of a switch.

Here, the configuration of the switch is illustrated in FIG. 4. FIG. 4A is a diagram illustrating a differential-type switch. Input signals D1, DX1 and input signals D2, DX2 are selected by a selector control signal SEL. The selector control signal is input to each switch 34 via a switch control signal path.

The input signals D1, DX1 side is input to a differential input unit including transistors Tr1 and Tr2. The input signal D1 is input to the gate of Tr1, and the input signal DX1 is input to the gate of Tr2. The source of Tr1 is coupled to a power VDD via a resistor R1. The source of Tr2 is coupled to the power VDD via a resistor R2. The source of a transistor Tr5 is coupled to a ground GND. Meanwhile the respective drains of Tr 1, 2, 5 are coupled. The selector control signal is input from the gate of Tr5.

The input signals D2, DX2 side is input to a differential input unit including transistors Tr3 and Tr4. The input signal D2 is input to the gate of Tr3, and the input signal DX2 is input to the gate of Tr4. The source of Tr3 is coupled to a power VDD via a resistor R1. The source of Tr4 is coupled to the power VDD via a resistor R2. The source of a transistor Tr6 is coupled to a ground GND. Meanwhile, the drains of Trs 3, 4, 6 are coupled. The selector control signal is input from the gate of Tr6 via an inverter INV1.

In other words, the conduction of Tr5 and Tr6 is controlled by switching the selector control signal. The control in this way enables the switching of signals output to output VOUT1 and output VOUTX1.

Figure 4B:
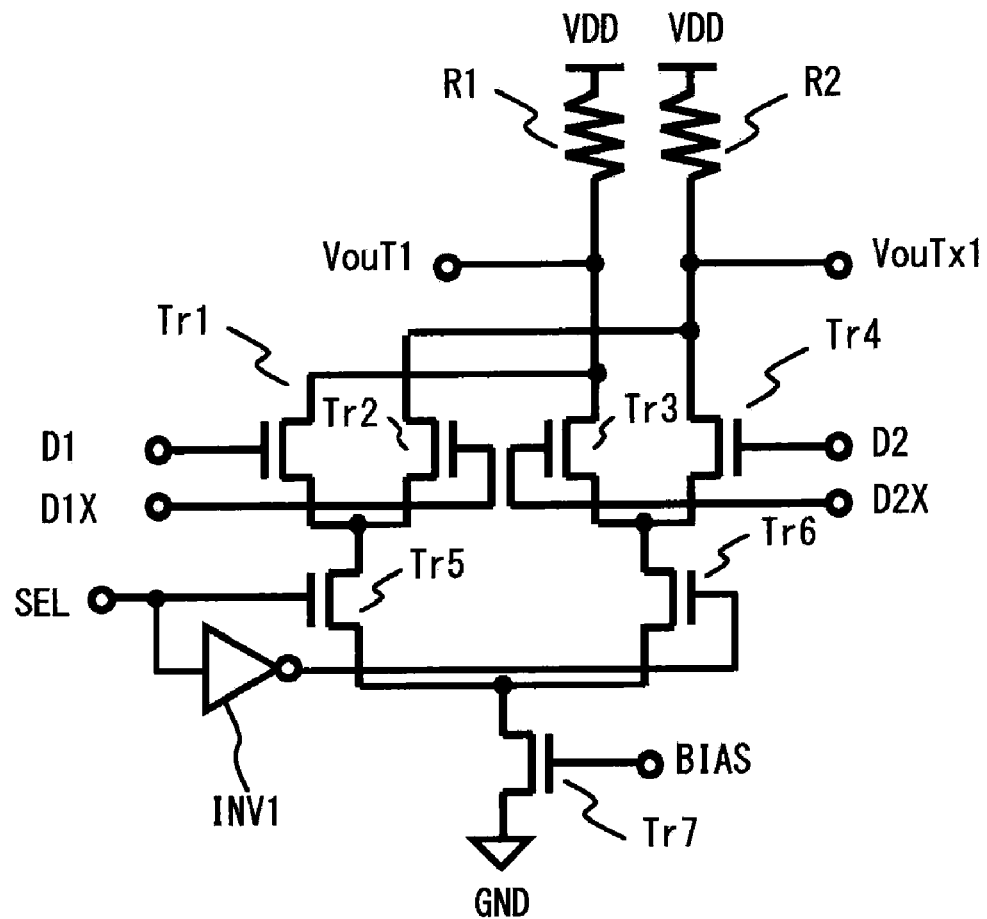
FIG. 4B is a diagram illustrating a configuration of a switch.

FIG. 4B is a variation of the circuit in FIG. 4A, in which a transistor Tr7 is inserted between Tr5, Tr6 and the ground GND to add a bias signal (BIAS).

Next, a control flow illustrated in FIG. 5 is explained.

In step S51, upon initialization of the IC chip and so on, a command for switching the pathway of the bypass signal path 36 that is a low-latency path as described above is issued to the internal logic circuit 32.

In operation S52, path determination is performed by the internal logic circuit 32. In other words, a switch control signal (switch control information) for the changeover of the switch 34 is generated.

In operation S53, the switch control signal is issued from a switch changeover controller in the internal logic circuit 32 to the switch 34.

In operation S54, each of the switches 34 receives the switch control signal, and switches the coupling of the internal circuit of the switch 34, in accordance with the switch control signal. Then, respective operations are put in the waiting state until the switching is completed.

In operation S55, upon the completion of the process for the switch 34 in S54, a completion signal is issued to the high-speed I/O transceiver 33. The high-speed I/O transceiver 33 that received the completion signal enters the enabled state, and becomes able to transmit/receive the input/output.

In operation S56, the IC chip enters the operating state and the high-speed I/O transceiver 33 starts the data transmission/reception.

(Embodiment 2)

Embodiment 2 is different from embodiment 1, and is an example of a case in which the internal logic circuit is operating at a slower clock frequency with respect to the signal data rate. For example, in FIG. 6, the data rate per a signal line of the transceiver is 6.4 (Gbit/sec), while the internal logic circuit is operating at a slow clock of 400 (MHz).

An IC chip 61 illustrated in FIG. 6 includes an internal logic circuit 62, high-speed I/O transceivers 63, Demux/MUX(1:2) units 64, switches 65, Demux/MUX(1:16) units 66, a bypass signal path 67, and switch control signal paths 68.

The high-speed I/O transceivers have eight pairs of I/O ports respectively including four pairs of high-speed I/O transceivers of which data rate is 6.4 (Gbit/sec). The transceiver in the I/O port performs the exchange of signals with the internal logic circuit of which operating frequency is 6.4 (GHz).

A signal received by the high-speed I/O transceiver 63 is transmitted to the internal logic circuit 62 via the Demux/MUX(1:2) unit 64, the switch 65 and the Demux/MUX(1:16) unit 66. In addition, the data in the internal logic circuit 62 is transmitted to outside by the high-speed I/O transceiver 63 via the Demux/MUX(1:16) unit 66, the switch 65 and the Demux/MUX(1:2) unit 64.

A signal received by the receiver of the Demux/MUX (1:16) unit 66 is subjected to serial-parallel conversion by 1:16 demultiplexor: Demux and passed to the internal logic circuit 62. Meanwhile, data output from the internal logic circuit 62 is subjected to parallel-serial conversion by 16:1 multiplexor: MUX and output from the high-speed I/O transceiver.

The switch 65 and the bypass signal path 67 are provided in the medium-speed signal path in which the frequency of input/output signals have become 3.2 (GHz) after passing through 1:2/2:1 Demux/MUX. A signal from the high-speed transceiver 63 is coupled to other high-speed I/O transceivers 63 (including its own port) via the bypass signal path 67 and the switch 65.

According to the present embodiment, a large-scale logic may be configured easily since the clock frequency of the internal logic circuit may be kept low, and the delay of the bypass signal path 67 and the switch 65 may be kept small.

(Embodiment 3)

Figure 7:
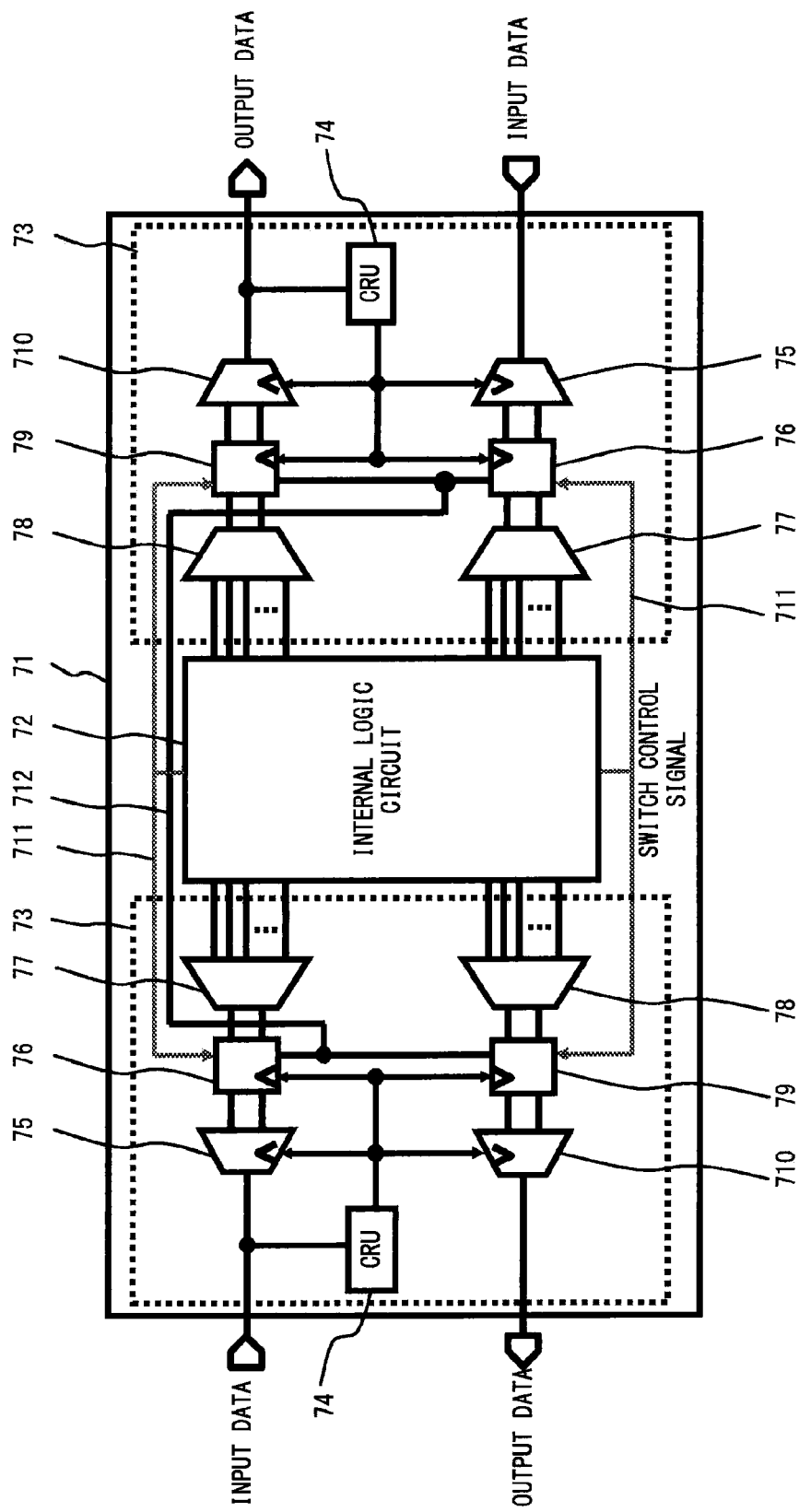
FIG. 7 is a diagram illustrating a configuration using a clock recovery circuit.

FIG. 7 is a diagram illustrating the configuration of embodiment 3 (however, the present example is the one using two transceivers).

In embodiment 3, the clocks of the source/destination that transmits/receives signals with the high-speed I/O are not necessarily synchronized completely, and include ones generated from an independent clock source. In order to receive such signals, the receiver of the high-speed I/O has a clock recovery circuit to generate a recovered clock synchronized with the clock at the transmitting side, and uses the recovered clock for receiving signals.

An IC chip 71 illustrated in FIG. 7 includes an internal logic circuit 72 and transceivers 73.

The transceiver 73 includes a clock recovery circuit (CRU) 74, demultiplexers 75, 77, a switch 76 (input side), a switch 79 (output side), multiplexers 78, 710, a switch control signal path 711 and a bypass signal path 712.

In the present embodiment, the demultiplexers 75, 77, the switch 76 (input side), the switch 79 (output side), the multiplexers 78, 710 are driven in accordance with a clock recovered by the clock recovery circuit 74.

According to the above configuration, there is no need to use the similar clock in the entire system, increasing the degree of freedom in the system configuration, and at the similar time, when a received signal is transmitted to the bypass path, the switch and the transmitter, no delay occurs accompanying the clock switching (FIFO is used generally).

(Embodiment 4)

Figure 8:
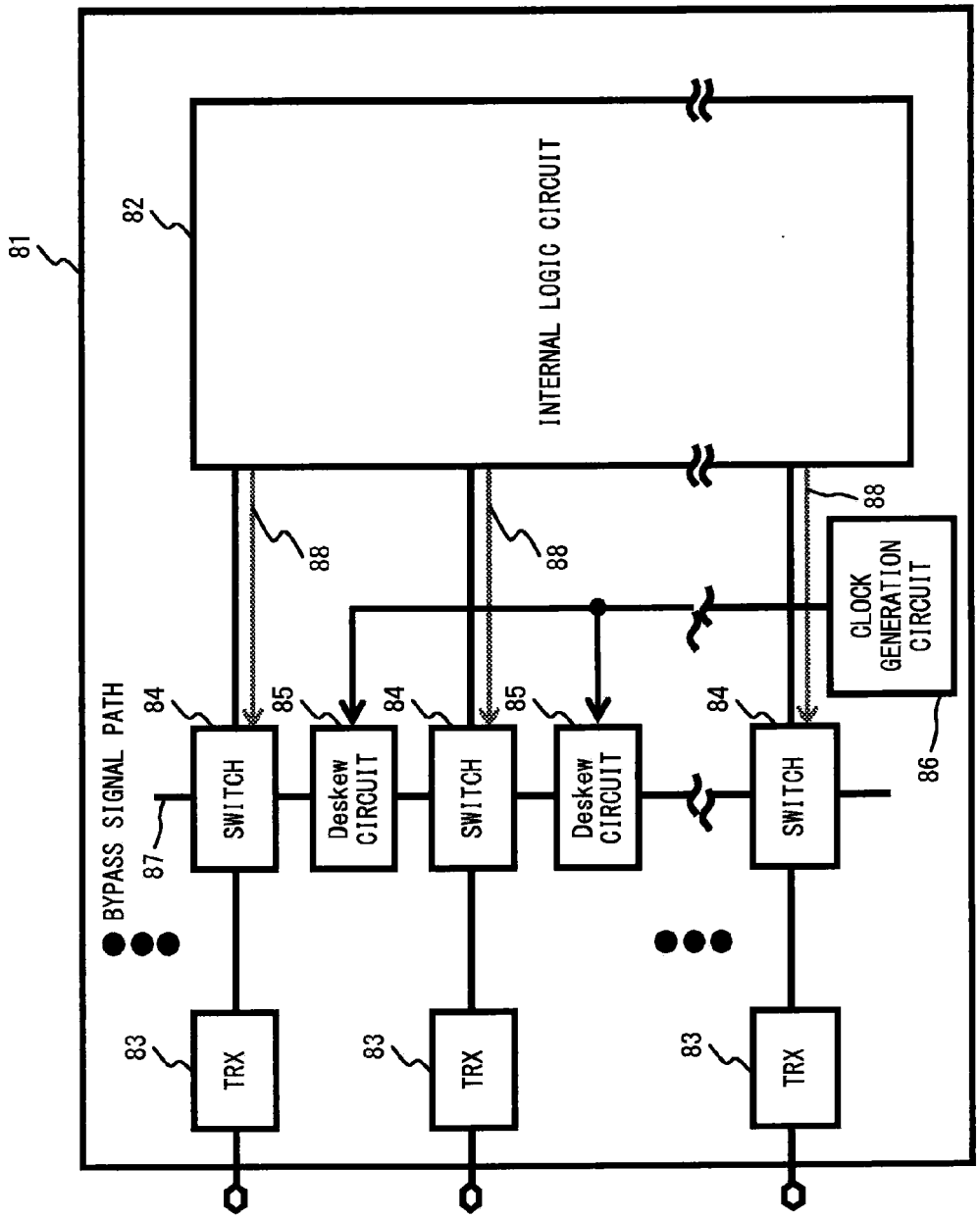
FIG. 8 is a diagram illustrating a circuit including, in its bypass signal path, a circuit for correcting a timing mismatch (skew) between a plurality of signal lines.

FIG. 8 is a diagram illustrating the configuration of embodiment 4. Embodiment 4 is a circuit in which in certain high-speed I/O ports, a circuit for correcting a timing mismatch (skew) between a plurality of signal lines is included in the bypass signal path.

An IC chip 81 illustrated in FIG. 8 includes an internal logic circuit 82, high-speed I/O transceivers 83, switches 84, timing correction circuits 85, a clock generation circuit 86, a bypass signal path 87 and switch control signal paths 88.

The correction of a skew is realized, after performing clock recovery for each of a plurality of signals and receiving the signals by performing timing matching (retiming) with a single clock. When there is a timing mismatch equal to or more than one bit time (1UI) of a signal, the timing matching is performed by a delay circuit including a flip flop. The timing matching in units of one bit time is performed upon the system start-up after the power is turned on. The switch 84 transmits data and a clock synchronized with the data to the timing correction circuit 85. In FIG. 8, the clock generation circuit 86 generates a single clock to perform the timing matching.

Figure 9:
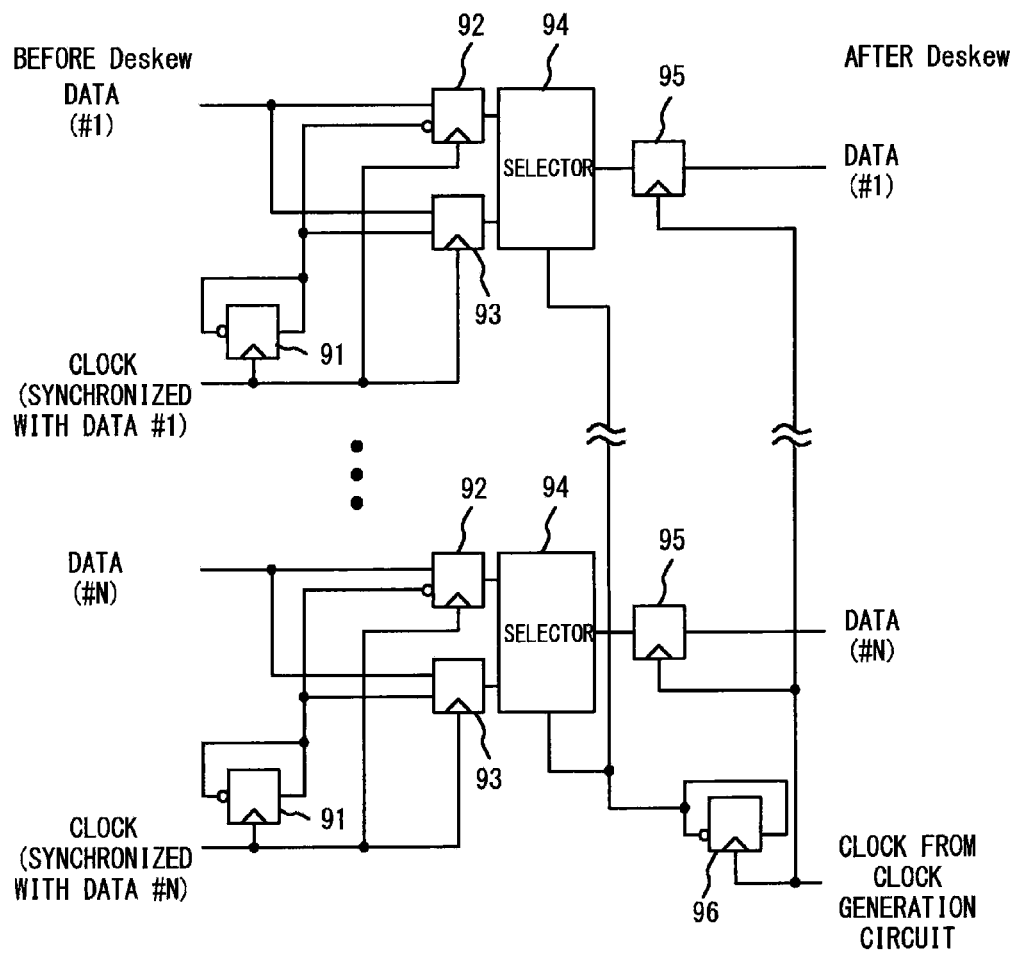
FIG. 9 is a diagram illustrating a configuration of a timing correction circuit 85.

FIG. 9 is a circuit illustrating the configuration of the timing correction circuit 85. In FIG. 9, an inter-bit timing correction circuit using a demultiplexer is explained.

In the timing correction circuit 85, an input for receiving data (#1-#N) from the switch 84 as well as a clock synchronized with the data is provided. When clocks are recovered on the basis of input data, however, each pieces of data are not synchronized as illustrated in FIG. 10, generating a skew. In other words, a skew occurs even between input signals synchronized with clock signals transmitted from a signal source having the similar clock source. Therefore, the data is input to the 1:2 demultiplexer illustrated in FIG. 9 including FFs 91, 92 and 93. For example, when input data (#1) "A" is input, data "A" obtained by the 1:2 Demuxing of the input data (#1) in FIG. 10 is output to the output of FFs 92 and 93. In this case, the output data "A" from the FF 92 has a double data length, and the output data "A" from the FF 93 is output with a shift corresponding to one cycle of the synchronous clock. After that, a clock generated by the clock generation circuit 86 is divided by an FF 96 and input to a selector 94, and data is selected alternatingly. After that, synchronization is performed by punching out, by the FF 95, the output of the clock 94 with the clock generated by the clock generation circuit 86.

The skew of data output from the switch 84 may be compensated also for each piece of data (#2-N) by performing the control in the similar manner as described above.

According to the present embodiment, the influence of the skew between a plurality of signals may be eliminated. For this reason, the application of the present embodiment to a back-plane type wiring topology in which a plurality of signals are transmitted over a middle distance (for example, 1m) makes it may possible to perform signal transmission in which not only the waveform disturbance but also the skew between the signal lines is compensated.

(Embodiment 5)

Figure 11:
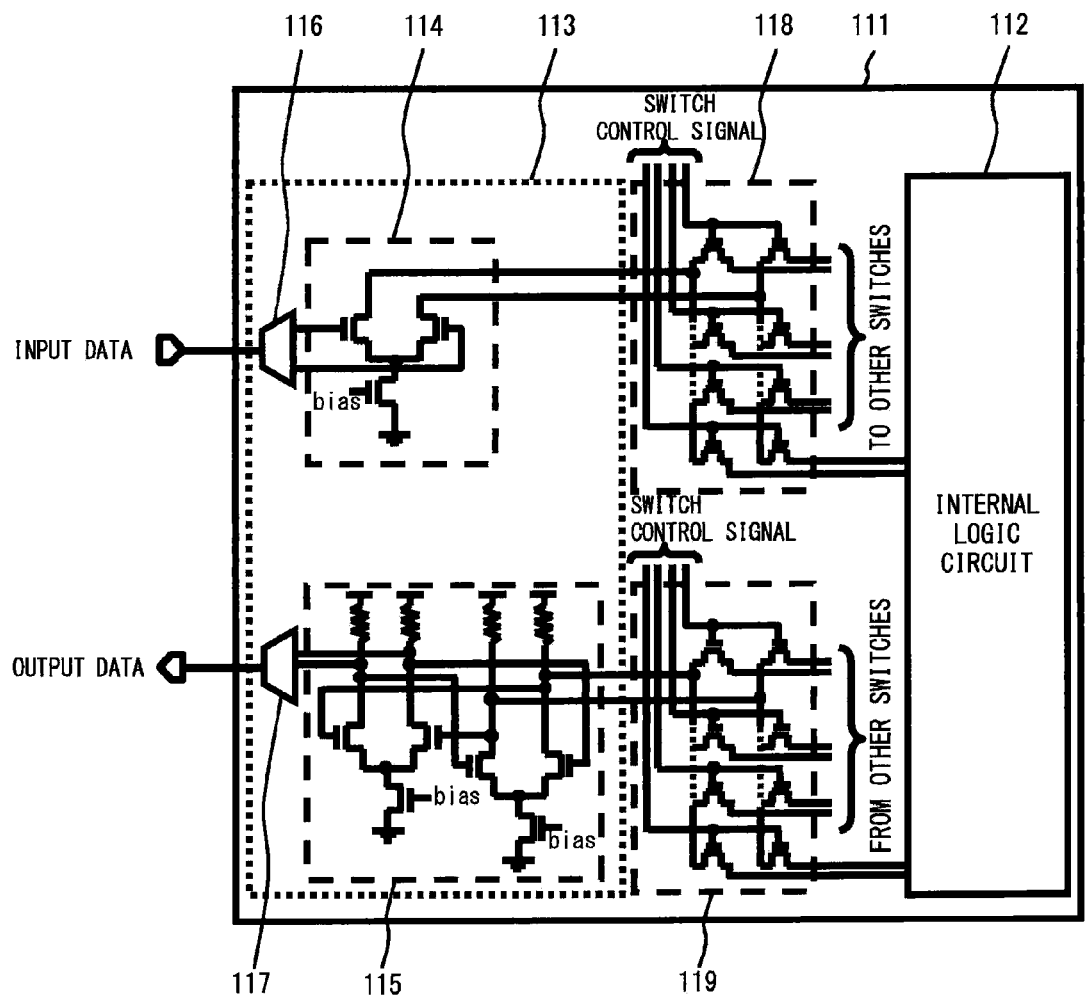
FIG. 11 is a diagram illustrating a configuration in which a current mode signal transmission circuit with a small amplitude is used for the data path of the bypass signal path (including a switch).

FIG. 11 is a diagram illustrating the configuration of embodiment 5. An IC chip 11 illustrated in FIG. 5 includes an internal logic circuit 112, a high-speed I/O transceiver 113 and switches 118, 119.

The high-speed I/O transceiver 113 includes a demultiplexer 116, a multiplexer 117, a current mode driver 114 and a current mode receiver 115.

The present embodiment uses a current mode signal transmission circuit with a small amplitude for the data path of the bypass signal path (including the switch). The transmission of a current mode signal is performed by the current mode driver 114 (using a differential pair) with a high output impedance, and the reception of the signal is performed by a current-voltage conversion circuit (transimpedance amplifier) with a low input impedance. The current feedback type with which the voltage output of the output buffer is converted into a current by transconductor amplifier and feedback to the output node is used for the transimpedance amplifier. In addition, the reception is performed by the current mode receiver 115 via the switches 118, 119.

The switch circuits 118, 119 have a tree structure including an nMOS switch in the data path. Since the current mode signal transmission is performed, there is little influence of voltage drop, and since a small signal voltage is used to drive a large-capacity internal wiring, the power consumption is reduced.

(Embodiment 6)

Figure 12:
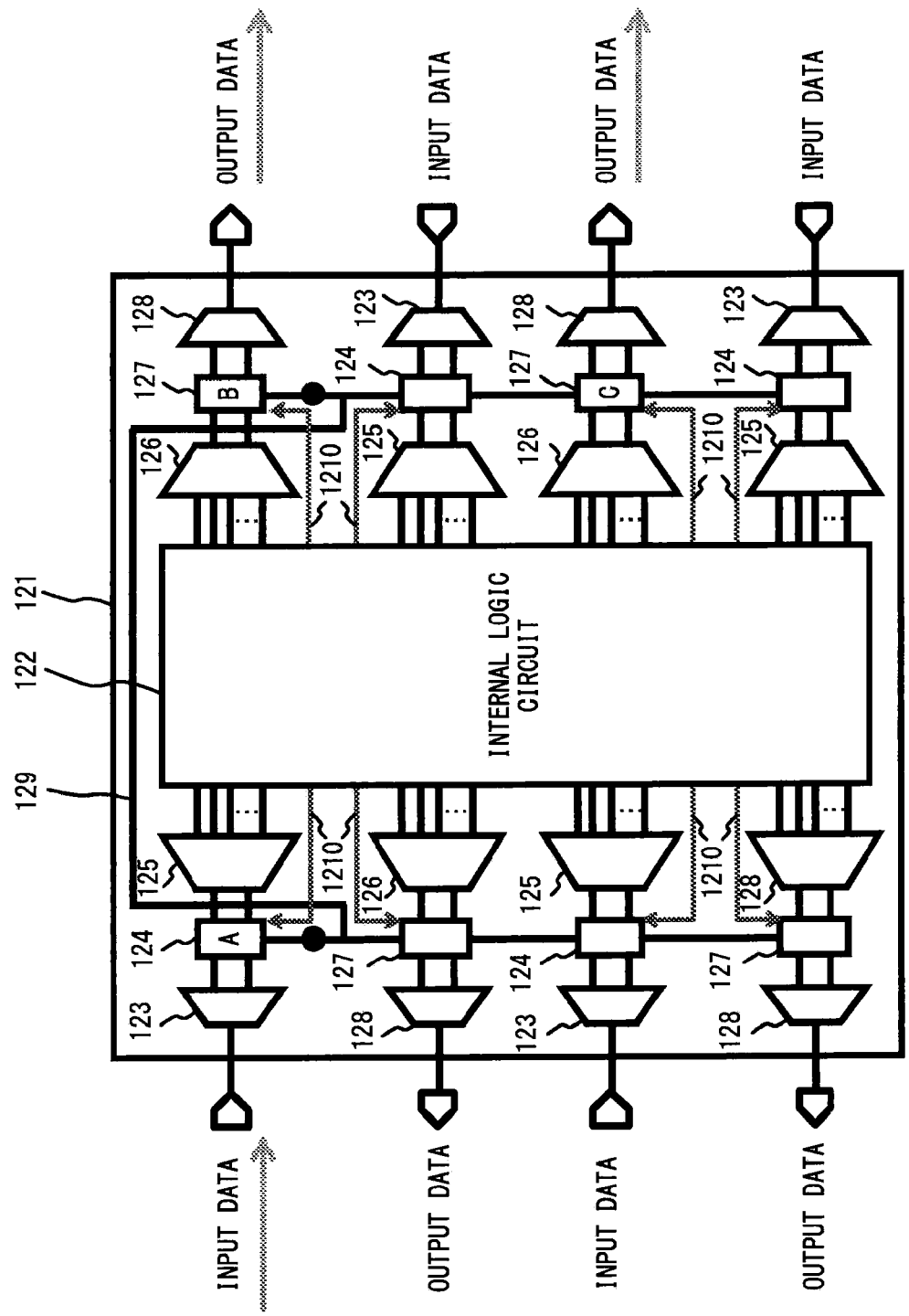
FIG. 12 is an example illustrating a configuration in which the similar signal is transmitted to a plurality of destinations by one-to-many coupling.

FIG. 12 is a diagram illustrating the configuration of embodiment 6. In the embodiments described above, the switch is selectively switched so that the high-speed signal lines on the board may be coupled one to one, and the propagation delay of signals hopping via the chip is also minimized. Then, since the signal lines are coupled one to one, there is no multiple reflection of a signal due to the multidrop coupling.

However, there is a case where the similar signal is transmitted to a number of destinations by one-to-many coupling. Then, when a signal is transmitted to the entire system, one-to-many signal broadcasting may be required. However, there is a problem that since the one-to-many signal broadcasting involves a large load capacity, it is difficult to broadcast a high-speed signal.

In embodiment 6, when transmitting a signal received by a receiver from outside the switch to a transmitter via a bypass signal path 129 and switches 124, 127, the similar signal may be broadcasted to a number of destinations by one-to-many coupling.

For example, an internal logic circuit 122 generates a switch control signal so that a switch A in FIG. 12 transmits a signal to switches B and C. Then, a switch changeover controller of the internal logic circuit 122 generates a switch control signal so that the switches B and C select the signal from the switch A.

The switch control signal performs the switching of the corresponding switches 127(A, B, C) via a switch control signal path 1210, and changes the coupling to one-to-many.

According to the present embodiment, signals may be transmitted while solving the problem described above.

(Embodiment 7)

Figure 13:
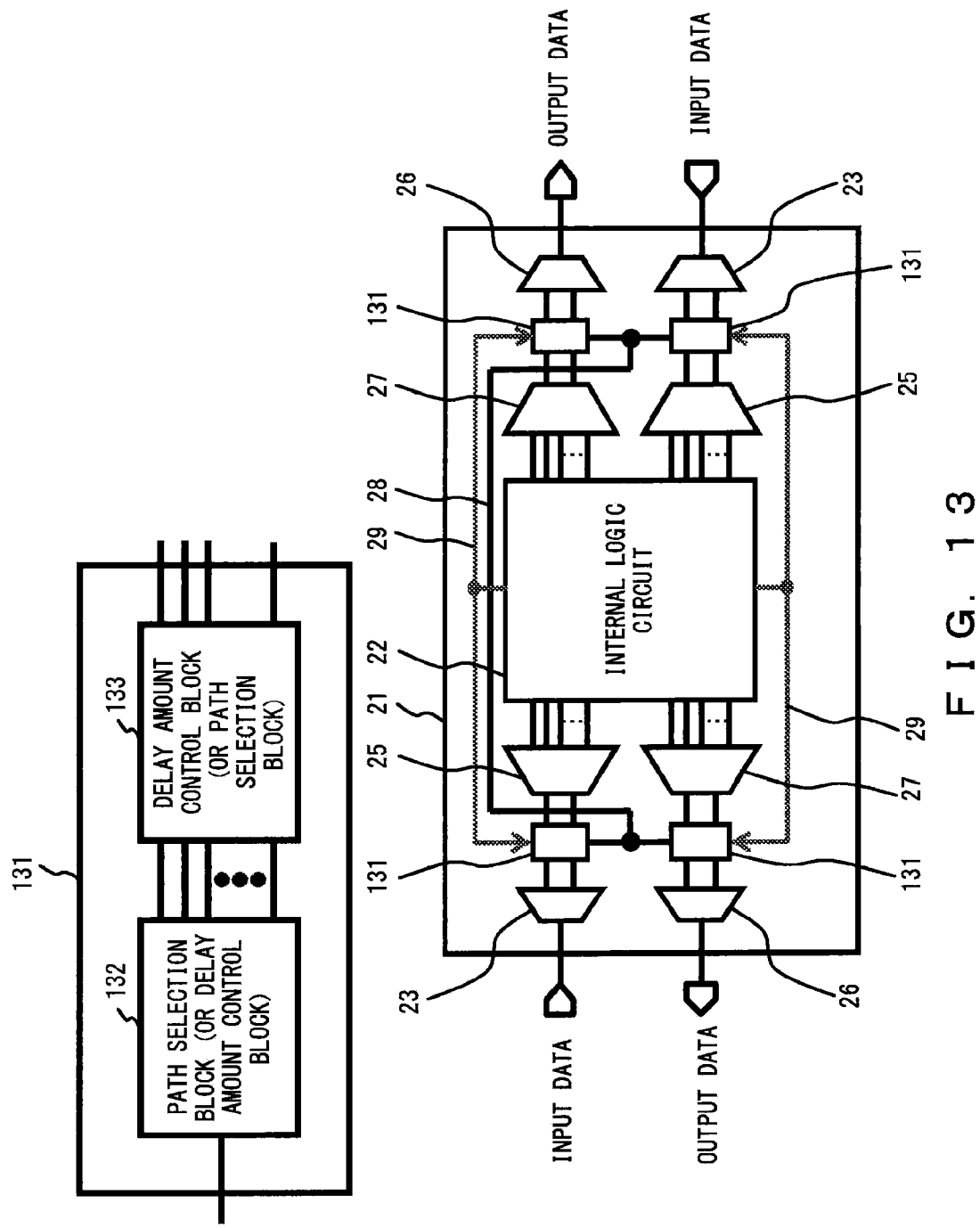
FIG. 13 is an example illustrating a configuration in which the delay amount is different respectively for each signal path of the bypass signal path.

FIG. 13 is a diagram illustrating the configuration of embodiment 7. According to this embodiment, the delay of a bypass signal path may be selected, and the delay amount of the bypass signal path may be changed respectively for each signal path.

In the circuit illustrated in FIG. 13A, a function for controlling the delay amount is provided in the switch 24 in the circuit illustrated in FIG. 2, in addition to the switching function for selecting the path.

A switch 131 illustrated in FIG. 13 includes a path selector 132 and a delay amount controller 133.

The path selector 132 performs switch changeover in accordance with a switch control signal transmitted from an internal logic circuit 22 via a switch control signal path 29 upon configuration.

The delay amount controller 133 changes the delay amount in accordance with a delay amount control signal transmitted from the internal logic circuit 22 via the switch control signal path 29 upon configuration.

For example, in the case of receiving a 3.2 (GHz) signal and returning a signal from the similar high-speed I/O port, a 1:2, 2:1 process performed using a multiplexer and a demultiplexer results in a delay of 4UI at the minimum in total. Meanwhile, in the case of transmitting a signal to a port on the opposite side with respect to the internal logic circuit 22, signal processing using 1:4, 4:1 demultiplexer and multiplexer results in a delay of 16UI. Thus, when the delay amount varies because of the system configuration, the delay amount is matched by means of the setting of the delay amount controller 133 in the switch 131. The configuration may also be made such that, as a method of matching the delay amount, the delay may be selected by inserting a flip flop into the signal path.

Meanwhile, for the delay amount, a delay circuit that changes the delay amount in terms of hardware by switching a plurality of passive elements such as the resistor and the capacitor may be used, or a plurality of buffer circuits using a desired clock may generate a delay corresponding to the clock. There is no limitation as long as it is a delay circuit.

In addition, there is no particular limitation with regard to the coupling order of the path selection block 132 and the delay amount controller 133.

Next, the control flow illustrated in FIG. 14 is explained.

In operation S141, with the initialization of the IC chip and so on, a setting command for performing the switching of the path of a bypass signal path 28 that is a low-latency path as described above and the switching of the delay amount is issued to the internal logic circuit 32.

In operation S142, the path determination is performed by the internal logic circuit 22. In other words, a switch control signal (switch control information) for performing the switching of the path for the switch 131 is generated. In addition, a delay amount control signal (delay amount control information) is generated for determining the delay amount to be set for each signal path.

In operation S143, the switch control signal is issued from the internal logic circuit 22 to the path selection block 132 of the switch 131.

In operation 144, the delay amount control signal is issued from the internal logic circuit 22 to the delay amount control block 133 of the switch 131.

In operation 145, each switch 34 receives the switch control signal, and switches the coupling of the path selector 132 of the switch 34 in accordance with the switch control signal, and also changes the delay amount of the delay amount control block 133 in accordance with the delay amount control signal. Respective operations are put into the waiting state until these switching processes are completed.

In operation S146, upon the completion of the processes in S143, 144, a completion signal (enable signal) is issued to the high-speed I/O transceiver. The high-speed I/O transceiver that received the completion signal enters the enabled state and becomes able to transmit/receive signals.

In operation S147, an IC chip 21 enters the operating state, and the high-speed I/O transceiver starts the transmission/reception of data.

According to the present embodiment, a short delay may be selected for the path with which the delay may be shortened, without making the delay amounts of all the signal paths equal, which makes it may possible to give a short delay to a signal, and to improve the overall system performance.

(Embodiment 8)

FIG. 15 is a diagram illustrating the configuration of embodiment 8. It is characterized in that transceivers are provided more than the given number, so that even if there is a failure in a transceiver or in a signal path coupled to it, signals may be transmitted by bypassing the faulty path.

An IC chip illustrated in embodiment 8 is an example in which a redundant circuit is added to the circuit in FIG. 3 illustrated for embodiment 1. In the circuit in FIG. 15, a high speed I/O transceiver 151, a switch 152 coupled to the bypass signal path 36 and a switch control signal path 153 are provided as the redundant circuit.

Next, the control flow illustrated in FIG. 16 is explained.

In operation S161, with the initialization of the IC chip and so on, a failure detection command for detecting the faulty part is issued to the internal logic circuit 32. The command may be issued regularly during operation.

In operation 162, a failure detection path (a path for detecting a failure) is determined by the internal logic circuit 32. In other words, a switch control signal (switch control information) is generated for performing the changeover of the switch 34 to check whether the high-speed I/O transceiver 33, the bypass signal path 36, the switch control signal path 35, the switch 34 and so on are operating normally. Furthermore, a circuit for determining the failure detection (failure detection determination circuit) in the internal logic circuit 32 is put into the enabled state (being able to make the determination).

Here, in the case of failure detection within the IC chip, failure detection information for performing switching to the failure detection path may be prepared in advance, and the stored failure detection information may be called up upon the reception of a failure detection command, to form the failure detection path. Meanwhile, failure detection information may be prepared in consideration of the coupling and configuration of another IC chip, to form the failure detection path. In other words, the response timing from another IC chip and so on may be measured to perform the failure detection.

In operation S163, a failure detection signal transmission command is issued from the internal logic circuit 32. At this time, the failure detection signal transmission command is issued to a corresponding high-speed I/O transceiver 33 via the switch 34. For example, the high-speed I/O transceiver that received the command makes the transmitter and the receiver in the high-speed I/O transceiver 33 operate to form a loop and to return the data to the internal logic circuit 32.

In operation S164, the data prepared in advance for identifying the faulty part is transmitted from the internal logic circuit 32 to the corresponding high-speed I/O transceiver 33. Then, whether the response is normal or not is determined by the failure detection determination circuit.

In operation S165, whether the process of S164 has been completed for all high-speed I/O transceivers 33 is checked.

In operation S166, when there is a failure according to the above operations, switching is performed so as to avoid the faulty path and to use the redundant circuit.

In operation S167, the IC chip enters the operating state and the high-speed I/O transceiver 33 starts the transmission/reception of data.

Thus, the reliability of the entire system may be improved significantly by adopting the redundant system for signals between chips.

(Embodiment 9)

FIG. 17 is a diagram illustrating the configuration of embodiment 9. Embodiment 9 includes IC chips 171-174. The IC chips 171-174 have internal logic circuits 175-178 and low-latency switch parts 179-1712(A-D).

The wiring between the respective IC chips 171-174 is done with bypass signal paths coupling the switch parts 179-1712 (A-D).

The coupling of the bypass signal path is switched by the switch parts 179-1712. For the changeover of the switch parts 179-1712, for example, a configuration setting command (coupling information) for the management (control and read-out) is generated by an internal logic circuit 178(D), and issued from the internal logic circuit 178 to the respective switch parts 179-1712 via the bypass signal path.

In this embodiment, there is no signal switch control signal path, and the configuration setting command is transmitted/received via the bypass signal path.

With this configuration, IC chips may be coupled with the completely-periodical one-to-one coupling since there is no control signal and the like except for the bypass signal path coupled between the IC chips, enabling the implementation with little problem of the degradation of signal quality.

According to the embodiments described above, since the signal lines are coupled one-to-one, the problem of multiple signal reflection due to multidrop coupling does not occur. In addition, since there is no signal crossing part, the problems of crosstalk and impedance mismatching that happen at a crossing part are suppressed. For these reasons, the transmission rate may be improved while avoiding the problem of the degradation of signal quality, improving the overall system performance.

The aforementioned embodiments may be applied to signal transmission between IC chips, between elements and between circuit blocks on an IC chip, and particularly to a technique of high-speed input/output circuit in which a low-latency bypass signal path and switch are provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments) of the present inventions have been described in detail, it should be understood that the various changes, substitutions, and alterations could be made hereto without departing from the spirit and scope of the invention.

What is claimed is:

1. An integrated circuit comprising:
    an internal logic circuit processing data input from one of a plurality of input terminals and outputs processed data to one of a plurality of output terminals;
    a plurality of bypass paths bypassing the internal logic circuit;
    a first switch, provided between a first input terminal included in the plurality of input terminals and the internal logic circuit, switching pathways of a first path used for inputting the data to the internal logic circuit from the first input terminal and a bypass path used for bypassing the internal logic circuit;
    a second switch, provided between a first output terminal included in the plurality of output terminals and the internal logic circuit, switching a pathway of the second path used for outputting the processed data to the first output terminal from the internal logic circuit and the bypass path used for outputting the data bypassing to the first output terminal; and
    a timing correction circuit correcting a timing mismatch between signals output from each of the first switch and the second switch, when an input signal synchronized with a clock signal is transmitted from a signal source having a clock source,
    wherein the internal logic circuit includes a switch changeover controller performing the functions of
        selecting at least one of paths within the logic circuit and the bypass path,
        generating a switch control signal for the changeover of the first switch and the second switch,
        issuing the switch control signal to the first switch and the second switch,
        entering a waiting state until the switching of the first switch and the second switch is completed, and
        issuing a completion signal when the switching of the first switch and the second switch completes,
    and wherein, when the input signal is input from the first switch or the second switch to the timing correction circuit, the timing correction circuit
        generates a first output signal having a doubled length of the input signal, and a second output signal is shifted from the first output signal by one cycle of the clock signal,
        selects the first output signal and the second output signal alternately by using a divided clock of the clock signal, and
        performs correction of timing by punching out the selected first or second output signal by the clock.

2. The integrated circuit according to claim 1, wherein serial-parallel conversion is performed for an input signal received by a receiver of one of transceivers, the serial-parallel converted signal being
    transferred to the bypass signal path configured with a path elected by performing the changeover of one of the first switch and the second switch by the switch changeover controller;
    transmitted to a transmitter that is included in the other of the transceivers; and
    output after parallel-serial conversion is performed.

3. The integrated circuit according to claim 1, further comprising:
    a clock recovery circuit recovering a clock synchronized with a signal at a receiver side of one of transceivers,
    wherein when a signal received by the receiver is transmitted from a transmitter that is included in the other of the transceivers via the bypass signal path, the transmitter operates in synchronization with the recovered clock.

4. The integrated circuit according to claim 1, wherein in case a signal received by a receiver is transmitted from a plurality of transmitters through the bypass signal path, a changeover of the corresponding one of the first switch and the second switch is performed to make a one-to-many configuration.

5. The integrated circuit according to claim 1, wherein at least one of the first switch and the second switch comprises a delay amount controller changing a delay amount of a signal transferred through the bypass signal path.

6. The integrated circuit according to claim 1, wherein the plurality of bypass paths exchange, between transceivers, a transfer signal transmitted/received between one of the transceivers by bypassing the internal logic circuit, the transceivers are provided more than a given minimum number, and even if there is a failure in the transceiver or a signal path coupled to the transceiver, a signal is transmitted while bypassing a faulty path.

7. The integrated circuit according to claim 1, wherein when a bypass signal path between the integrated circuits is changed, information given for a changeover of at least one of the first switch and the second switch goes through the transceiver.

8. The integrated circuit according to claim 1, wherein in the bypass signal path, transmission is performed using a small-amplitude signal.

9. The integrated circuit according to claim 1, wherein at least one of the first switch and the second switch is a crossbar switch.

10. The integrated circuit according to claim 1, wherein the plurality of bypass paths exchange, between transceivers, a transfer signal transmitted/received between one of the transceivers by bypassing the internal logic circuit.

* * * * *